United States Patent
Maa et al.

(10) Patent No.: US 6,350,699 B1
(45) Date of Patent: Feb. 26, 2002

(54) METHOD FOR ANISOTROPIC PLASMA ETCHING USING NON-CHLOROFLUOROCARBON, FLUORINE-BASED CHEMISTRY

(75) Inventors: Jer-shen Maa; Fengyan Zhang, both of Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/584,407

(22) Filed: May 30, 2000

(51) Int. Cl.[7] .............................. H01L 21/00; C23F 1/00
(52) U.S. Cl. ........................... 438/720; 216/67; 216/75; 438/742
(58) Field of Search ..................... 216/67, 75; 438/712, 438/720, 728, 732, 742

(56) References Cited

U.S. PATENT DOCUMENTS

| | | | |
|---|---|---|---|
| 3,615,956 A | 10/1971 | Irving et al. | 156/17 |
| 3,795,557 A | 3/1974 | Jacob | |
| 4,026,742 A | 5/1977 | Fujino | 156/643 |
| 5,515,984 A | 5/1996 | Yokoyama et al. | 216/41 |
| 5,869,802 A | 2/1999 | Spencer et al. | 219/121.48 |
| 6,046,116 A | 4/2000 | DeOrnellas et al. | 438/715 |
| 6,077,450 A * | 6/2000 | Lee | 216/75 X |
| 6,143,191 A * | 11/2000 | Baum | 216/75 X |

OTHER PUBLICATIONS

Article entitled, "Platinum Etching and Plasma Characteristics in RF Magnetron and Electron Cyclotron Resonance Plasmas" by Nishikawa et al., published in Jpn J. Appl. Phys. vol. 32(1993) pp. 6102–6108.

Article entitled, "Etching new IC Materials for Memory Devices" by DeOrnellas, et al., published in Solid State Technology, Aug. 1998, pp. 53–58.

Article entitled, "Insight into the Dry Etching of Fence–Free Patterned Platinum Structures", by K. R. Milkove, et al., published in J. Vac. Sci. Technol. A 15(3), May/Jun. 1997, pp. 596–603.

Article entitled, "Sidewall Deposition Film in Platinum Etching with Ar/Halogen Mixed Gas Plasmas", by T. Shibano, et al., published in J. Vac. Sci. Technol. B 15(5), Sep./Oct. 1997, pp. 1747–1751.

Plasmaquest, Inc. materials (title and date unknown) consisting of 20 pages.

* cited by examiner

Primary Examiner—William A. Powell
(74) Attorney, Agent, or Firm—Matthew D. Babdau; David C. Ripma; Scott C. Krieger

(57) ABSTRACT

A method of anisotropically etching metals, especially iridium, platinum, ruthenium, osmium, and rhenium using a non-chlorofluorocarbon, fluorine-based chemistry. A substrate having metal deposited thereon, is inserted into an ECR plasma etch chamber and heated. A fluorine containing gas, such as, carbon tetrafluoride ($CF_4$), nitrogen trifluoride ($NF_3$) or sulfur hexafluoride ($SF_6$) is introduced into the chamber and ionized to form a plasma. Fluorine ions within the plasma strike, or contact, the metal to form volatile metal-fluorine compounds. The metal-fluorine compounds are exhausted away from the substrate to reduce, or eliminate, redeposition of etch reactants.

18 Claims, 3 Drawing Sheets

METHOD FOR ANISOTROPIC PLASMA ETCHING USING NON-CHLOROFLUOROCARBON, FLUORINE-BASED CHEMISTRY

BACKGROUND OF THE INVENTION

This invention relates generally to semiconductor technology and more particularly to a method of etching metal using fluorine-based chemistry.

As semiconductor technology continues to develop, a variety metals are being used in a wider variety of applications. Many of these metals present processing challenges, including problems associated with properly etching these metals. Platinum and iridium, for example, are finding use in ferroelectric memory devices and other devices. At the same time these metals are coming into wider use, the overall dimension of the devices continues to shrink. As the devices shrink, critical dimensions (CD) need to be maintained to greater accuracy.

Maintaining critical dimensions is made more difficult in the case of some metals, such as platinum and iridium, in that a suitable method of etching to pattern devices has not been available. Many of the present methods of etching, including plasma etching, produce residue that redeposits onto the substrate.

Plasma etching is accomplished by a combination of two mechanisms, physical etching (also referred to as "sputtering"), and chemical etching. Prior art methods of etching platinum and iridium have involved primarily sputtering of the metal with some chemical etching. The chemical etching that has been reported involves the formation of non-volatile etch products. Sputtering is a form of physical etching that works by bombarding the surface with particles causing the underlying material to be removed by the force of the impact.

Prior art methods of platinum etching with argon/halogen mixed gas plasmas, and similar methods, utilize predominately sputtering, which produces a redeposition of etch products along mask sidewalls. Prior art methods also utilize chemical reactions in part, but produce etch products that are non-volatile. These non-volatile etch products are often redeposited as well. For example, prior art methods often use chlorofluorocarbons or other chlorine containing gases. Iridium, platinum and other metals form metal-chlorides that are non-volatile at reasonably obtainable process temperatures and conditions. This redeposition of sputtered material and non-volatile etch products produce structures commonly referred to as fences, because the redeposited material remains even after the mask has been removed. Several methods exist for removing the fences, however the overall process does not maintain critical dimensions well. In general, it is not uncommon for the etching of patterned platinum structures to produce feature sizes that consistently exceed the original dimensions of the mask. This increase in dimension has also been noted for so called "fence-free" platinum structures. Further investigation has revealed that so called "fence-free" patterned platinum structures, are often achieved through processes that produce a transient fence and then through continued etching remove the transient fence. This results in a change in both sidewall angle, and overall dimensions.

Another problem associated with prior art etch techniques is redeposition of etch products generally. The redeposition, which produces fence structures, can also cause other sorts of failures including possible electrical shorts within the final device due the metal content of the redeposited material. The prior art solution to this problem has been to add additional cleaning steps of various kinds, including wet etch, plasma ash, and standard wet clean processes. These additional processes can also add complexity and uncertainty to the processes, resulting in less overall control of critical dimensions.

Previous methods used a quartz tube reaction chamber at pressures above 100 mTorr. This configuration did not allow for direction control of the reactants. Also, at higher pressures within those chambers chemical etching was isotropic (meaning that etching occurs in multiple directions). Isotropic etching causes undercuts, which lead to greater difficulty in forming desired structures and in controlling critical dimensions.

Current methods of etching platinum and iridium generally have etch rates of less than 400 angstroms per minute.

It would be advantageous to have a method of etching platinum, iridium and certain other metals that would not produce fence structures.

It would be advantageous to have a method of etching platinum, iridium and certain other metals that would allow for greater control of critical dimensions.

It would be advantageous to have a method of etching platinum, iridium and certain other metals that reduces, or eliminates, the amount of redeposited residue.

It would be advantageous to have a method of etching platinum, iridium and certain other metals that was anisotropic.

It would also be advantageous to have a method of etching platinum, iridium and certain other metals at a rate faster than 400 angstroms per minute.

SUMMARY OF THE INVENTION

Accordingly, a method of etching, or removing, metal from selected areas of a substrate is provided. First a substrate is prepared for further processing according the present method, with any desired circuit structures previously formed on the substrate. Then metal is deposited over the substrate. The present method is well suited for use with metals that form volatile compounds with fluorine, such as, iridium, platinum, ruthenium, osmium, and rhenium. A substance is generally considered volatile if it readily vaporizes at a relatively low temperature. As used herein, the term "volatile" characterizes substances that readily vaporize at temperatures and pressures readily obtainable in connection with the processing of semiconductor devices. Preferred ranges of temperature and pressure are provided within the detailed description.

Once the metal has been deposited, a mask layer is formed and patterned to expose selected areas of the metal. Methods of forming and patterning masks are well known. One common type of mask is a photoresist mask. Another common type of mask is referred to as a hard mask, which is commonly formed using silicon dioxide or silicon nitride. Photoresist masks are suitable for use of the present method at lower temperatures, but hard masks are generally preferred at higher temperatures, which may be desirable when practicing the present method. Photoresist has a tendency to become unreliable, or breakdown, at lower temperatures than hard mask materials.

After patterning, the metal is heated and exposed to a fluorine-containing plasma within a chamber. The chamber is preferably an ECR plasma etch chamber at a pressure of between 5 and 50 mTorr. The metal is heated by heating the substrate which is placed on a heated chuck. By controlling the temperature of the chuck, it is possible to control the temperature of the substrate and metal. The metal is heated to a point where it will produce a volatile metal-fluoride compounds when exposed to the fluorine within the plasma, typically the temperature is above 150 degrees Celsius for iridium and above 190 degree Celsius for platinum. The volatile metal-fluoride compounds essentially forms a vapor within the chamber. The vapor is then exhausted by a pump.

By producing and volatile compounds, the present invention reduces, or eliminates, residue. Due to the additional effects of sputtering within the chamber as well as the presence of other gases or materials which may form non-volatile compounds, some intermediate residue may be inadvertently deposited. Preferably, the amount of residue that is redeposited will be slight, and continuing etch effects during this process will eliminate residue.

Since chlorine forms non-volatile compounds with for example iridium and platinum, as well as other metals, it is preferable to use a source of fluorine that does not include chlorine. Therefore, chlorofluorocarbon gases will preferably not be used as the source of fluorine. The preferred sources of fluorine are carbon tetrafluoride ($CF_4$), nitrogen trifluoride ($NF_3$) or sulfur hexafluoride ($SF_6$). Oxygen may also be introduced into the chamber to free up additional fluorine. In addition, inert dilutant gases, such as, argon, neon or helium or other common process gases may be introduced into the chamber.

DETAILED DESCRIPTION OF THE INVENTION

The present invention provides a method of etching metals, especially iridium, platinum, ruthenium, osmium, or rhenium using a fluorine-based gas. A wafer has been prepared by using well known techniques to form integrated circuit (IC) features (e.g. transistors and other active and passive devices) on the wafer. The type and number of integrated circuit features on the wafer are unimportant to the process of the present invention. The form, and architecture of the various structures, as well as the methods of forming such structures, are not described herein and are a matter of design choice well known to those skilled in the art. Preferably the metals are etched in such a manner as to reduce, or eliminate, residue on the wafer.

The method of the present invention uses fluorine-based chemistry to etch metals. The fluorine-based chemistry will provide a chemical etch mechanism, in addition to, or instead of, the sputtering mechanism that dominates prior art etch methods for iridium and platinum. Although, the current applications of the present method are addressed primarily to those employing iridium and platinum, the present invention is also suited to etching of ruthenium, osmium, rhenium and other metals producing volatile etch reactants with fluorine. The following table summarizes the melting points and boiling points of the desired reactants:

| Compound | melting point (° C.) | boiling point (° C.) |
|---|---|---|
| IrF6 | 44 | 53 |
| PtF6 | 58 | |
| OsF6 | 32 | 46 |
| ReF6 | 19 | 34 |
| RuF5 | 101 | 250 |

The relatively low melting points and boiling points as compared to other prior art reactants with chlorine, fluorine, or other chemistries, support the ability of producing volatile metal-fluoride compounds at temperatures which are readily attainable and suitable for use during wafer processing.

Figure 1:
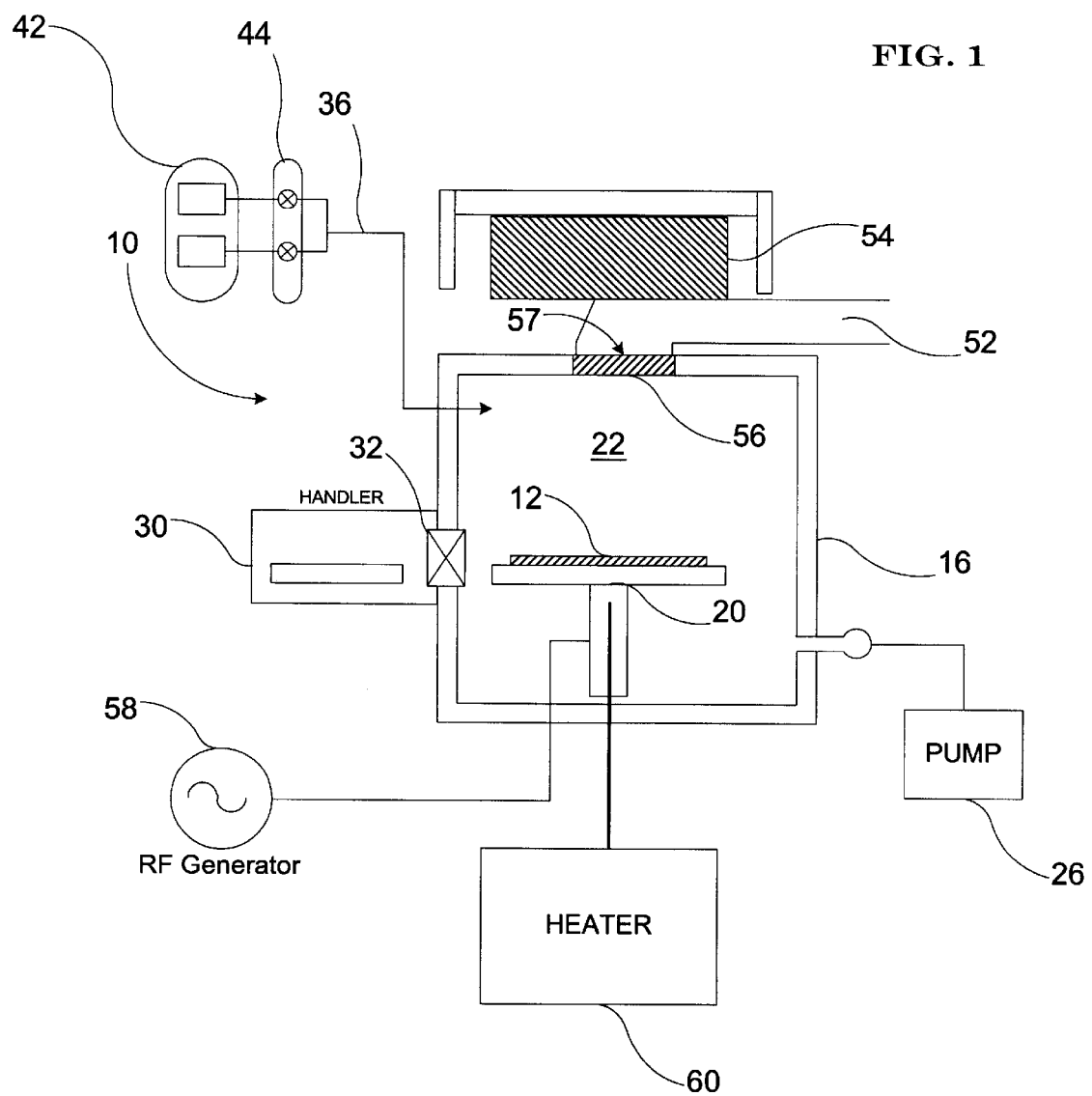
FIG. 1 is a schematic cross-sectional view showing an ECR plasma etch apparatus.

FIG. 1 is a schematic illustration of a suitable electron cyclotron resonance (ECR) plasma etching apparatus 10 for carrying out a plasma etch process on a substrate, such as a wafer 12. For clarity, the components depicted are not drawn to scale and some items of the total construction are not depicted. For a more detailed explanation of the ECR plasma etching apparatus, see *Plasma Producing Structure*, U.S. Pat. No. 5,869,802. Apparatus 10 includes a chamber 16 of a size suitable for holding one or more wafers 12, which are supported in chamber 16 on a chuck 20. As is typical of such chambers, an interior 22 can be evacuated or pressurized as desired by a suitable pump and valve apparatus, which is schematically illustrated in FIG. 1 by pump 26. Gas pressure within chamber 16 is preferably maintained between approximately 5 mTorr and 50 mTorr during processing.

Pump 26 is also used to exhaust chamber 16 during processing, while still maintaining the desired pressure with chamber 16. Individual wafers 12 are moved in and out of chamber 16 by a suitable wafer handler 30 through a gate valve 32 in a wall of chamber 16 and onto or off of chuck 20.

Selected gases used in plasma etch processing are introduced into the chamber through a suitable manifold system 36 from various gas supply reservoirs indicated collectively at 40, controlled by valves 42. Although for purposes of illustration only two supply reservoirs are shown, as many reservoirs as are necessary will be used. It is also possible to combine one or more of the gases into a single supply reservoir prior to introduction into chamber 16. The gases are introduced into apparatus 10 and ionized to form a plasma.

In order to ionize the introduced gases to form a plasma, apparatus 10 has a waveguide 52 situated adjacent chamber 16 and a permanent magnet 54 adjacent waveguide 52 opposite chamber 16. A window 56, constructed of material transparent to microwave radiation, such as quartz or aluminum oxide, is located just below waveguide 52 to allow microwave radiation to enter chamber 16. Waveguide 52 is connected to a power generating source (not shown) and conveys microwave energy produced by the generating source along its length to an end 57 aligned with window 56, whereby microwave energy is directed into chamber 16.

Microwaves exiting waveguide 52 pass through window 56 and enter chamber 16, propagating in a direction substantially perpendicular to wafer 12. The ECR power is in the range of between approximately 300 watts and 2000 watts. An RF bias 58 is also applied to chuck 16 to attract ions to wafer 12 in a direction that is also substantially perpendicular to wafer 12. The RF bias power is preferably in the range of 50 watts to 1000 watts. The power levels are specified above are based upon a 6-inch diameter wafer. One of skill in the art will be able to adjust the power level as needed for different size wafers.

The bias on the chuck and the low pressure within the chamber help to cause the fluorine ions to travel in a direction substantially perpendicular to the wafer. This cause anisotropic etching in the direction perpendicular to the wafer. This anisotropic etching reduces, or eliminates, undercutting and improves overall critical dimension control.

Chuck 20 is heated to a desired temperature, a heating element 60 is shown schematically. Heating element 60 and chuck 20 are used together to select the temperature of wafer 12 during processing. The chuck is heated to maintain a wafer temperature high enough to produce volatile metal-fluorine reactants. The wafer temperature is preferably greater than 150 degrees Celsius. For iridium etching, the wafer temperature is preferably between approximately 150 and 400 degrees Celsius. For platinum etching, the wafer temperature is preferably between approximately 190 and 500 degrees Celsius.

Figure 2:
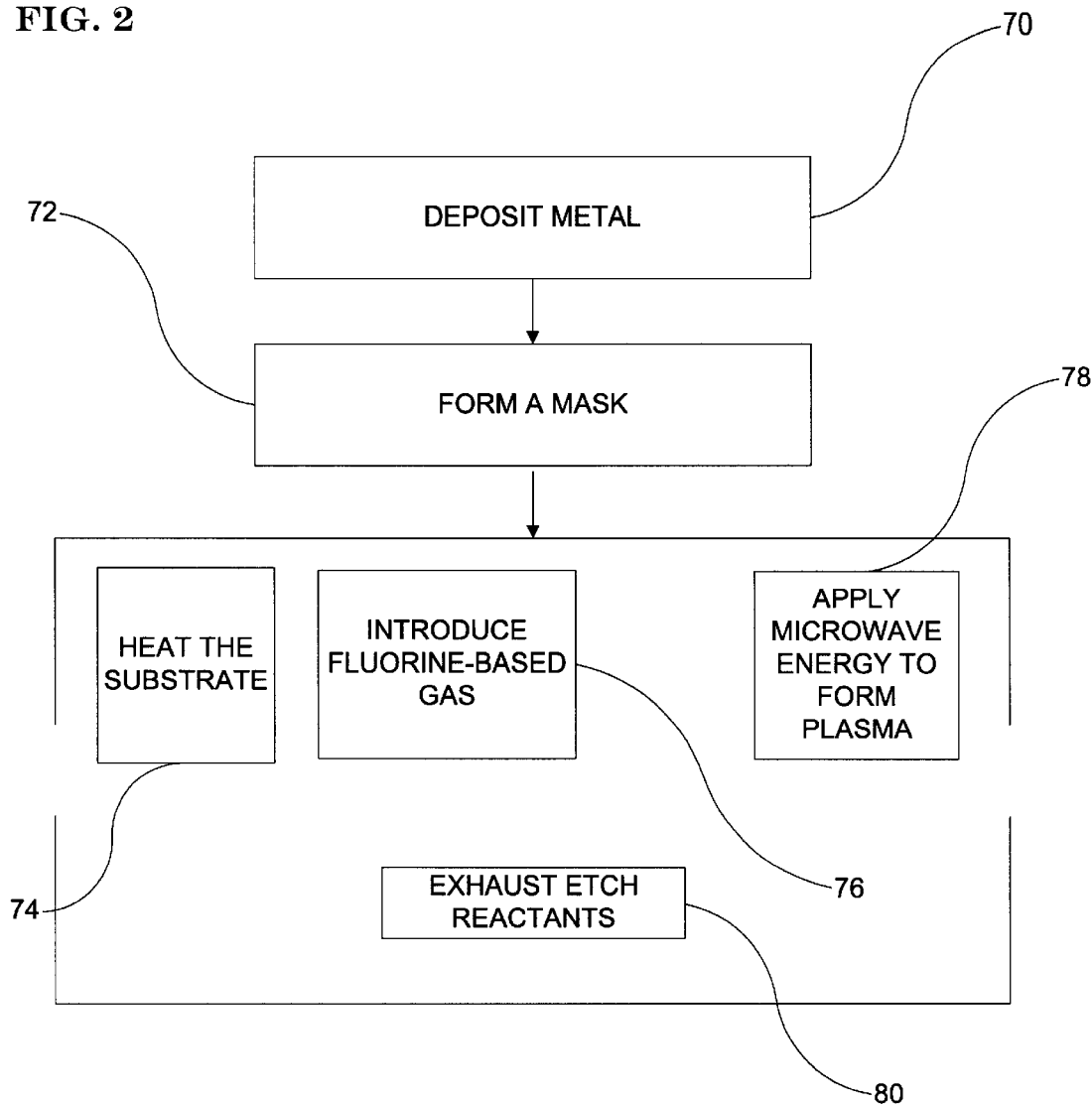
FIG. 2 is a block diagram illustrating the steps in the method for etching platinum, iridium and certain other metals on a substrate in a chamber as shown in FIG. 1, in accordance with the present invention.

FIG. 2 illustrates the steps of the method of the present invention, which will be described with reference to FIGS. 1 and 2. A wafer 12 is prepared, and then positioned on chuck 20 in chamber 16 by wafer handler 30. Wafer 12 is typically a silicon wafer, which has been prepared for further processing according to the method of the present invention. The first step in FIG. 2 is step 70, which is the depositing of a metal on wafer 12. Preferably, the metal is selected from the group consisting of iridium, platinum, ruthenium, osmium, or rhenium. The metal is deposited by any desired method, including metal evaporation.

Step 72 is the formation of a mask. Preferably, a hard mask will be formed using silicon dioxide or silicon nitride. Although the hard mask is preferred, the present invention can also utilize a photoresist mask provided that the temperature does not exceed the point at which the photoresist is no longer able to act as a suitable mask. As new mask materials and techniques are developed the present method is expected to find uses in connection with a variety of additional processes. At the present time, a hard mask is preferred due to the temperatures used in connection the method of the present invention.

Step 74 is the heating of the wafer to a temperature at which the metal will form a volatile compound with fluorine, typically above 150 degrees Celsius.

Step 76 is the introduction of a fluorine-based gas. The fluorine containing gas is preferably carbon tetrafluoride ($CF_4$), nitrogen trifluoride ($NF_3$) or sulfur hexafluoride ($SF_6$). In another preferred embodiment of the present invention chlorofluorocarbons are not used as a source of fluorine, as they also contain chlorine, which produces nonvolatile etch reactants with platinum and iridium.

During steps 72, 74, and 76 suitable microwave power is applied to produce a plasma within chamber 16 as illustrated by step 78. As known to those of skill in the art of ECR etch processing, the introduced gases are ionized. The fluorine-based gases produce fluorine ions within the plasma. In a preferred embodiment of the present invention, oxygen can also be introduced to react within the plasma to free up additional fluorine, which will also react with the metal. Typically between 2% and 20% oxygen will be added to the fluorine-based gas.

As the etch process continues, etch reactants are formed. As shown by step 80, the etch reactants are preferably simultaneously removed.

The following is a specific experimental example of the method of the present invention:

EXAMPLE

Six inch p-type (100) wafers are steam oxidized in a tube furnace to form 4000 Å–5000 Å thick oxide over the wafers prior to deposition of metal films. Wafers are then loaded into a planetary within an e-beam evaporation system. The background pressure of the e-beam system was in the $10^{-8}$ Torr range. During iridium deposition the complete planetary and the wafers are heated by quartz lamps. The temperature was controlled at 225 Celsius by thermocouples inserted near the planetary. In order to improve film adhesion, a thin titanium (Ti) layer of about 200 Å is deposited on the oxide before continuing with iridium deposition.

Following deposition of iridium, silicon nitride is deposited over the wafer by plasma-enhanced chemical vapor deposition (PECVD). Then photoresist is applied over the wafer and patterned. The silicon nitride layer is then plasma etched to form a hard mask for subsequent iridium etching.

The plasma etching process is performed in a PlasmaQuest ECR enhanced reactive ion etch system. This system is a single-wafer load-lock system. ECR plasma is introduced from the top of the process chamber. ECR power is maintained at 800 watts. The wafer is located on a heated chuck. The heated chuck is used to maintain the wafer at a temperature of approximately 300 degrees Celsius. The wafer temperature is calibrated with respect to the temperature of the chuck at 15 mTorr. RF bias is applied to a bottom electrode maintained at 400 watts. The pressure is maintained at 15 mTorr. A flow of $CF_4$ at 50 sccm and a flow of oxygen at 5 sccm is introduced into the system.

The results of this example produce an etch rate of iridium greater than 1000 Å per minute.

Figure 3:
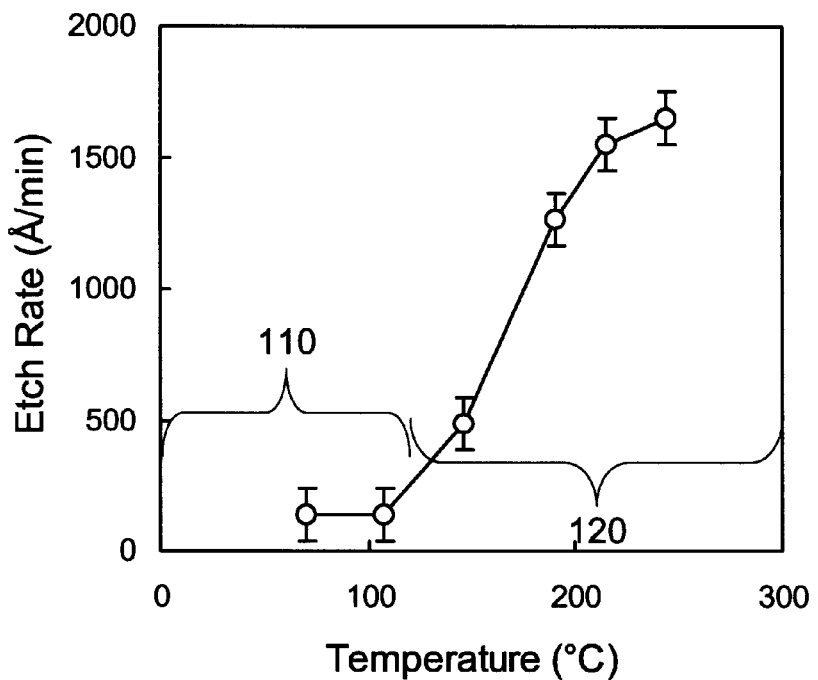
FIG. 3 is a graph showing the effect of temperature on the etch rate of iridium using fluorine-based gases.
Figure 4:
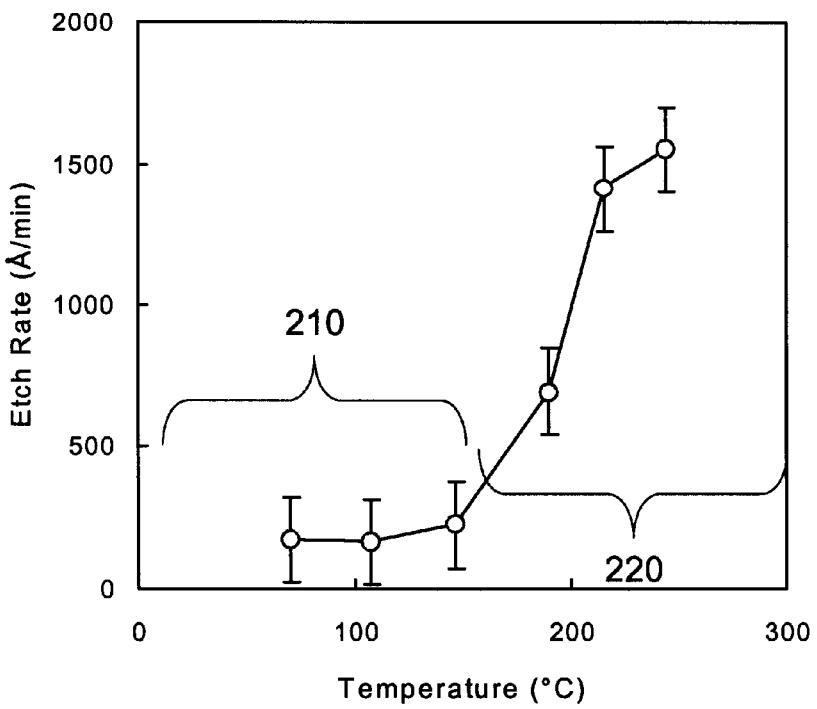
FIG. 4 is a graph showing the effect of temperature on the etch rate of platinum using fluorine-based gases.

FIGS. 3 and 4, show examples of the affect of temperature on the etch rate carbon tetrafluoride on iridium and platinum. Referring first to FIG. 3, the etch rate of iridium is relatively flat and well below 400 Å per minute at temperatures below 100–150 degrees Celsius (shown as 110). This is consistent with the results known in the prior art. As the temperature of the wafer is maintained at higher temperatures (shown as 120) during processing, as provided by the method of the present invention, the etch rate increase significantly. This increase in etch rate is due to the chemical reaction of fluorine with iridium to form a volatile etch reactant. The added heat is necessary to produce a reaction between the iridium and the fluorine within the plasma. At lower temperature, the etch rate is primarily a function of sputtering. At higher temperatures the etch rate is greatly affected by chemical reactions. The etch reactant is believed to be primarily iridium hexafluoride. Iridium hexafluoride has a melting point of 44 degrees Celsius and a boiling point of 54 degrees Celsius, which suggests that it may be formed as a volatile compound at temperatures where the increase in etch rate becomes noticeable.

Referring now to FIG. 4, similar results are shown for the etch rate of platinum in carbon tetrafluoride. The etch rates at lower temperatures (shown at 210) are consistent with the prior art. However, once again at a higher range of temperatures (shown at 220) the etch rate increases significantly. The rate at which the etch rate changes is somewhat higher for platinum than that previously shown in FIG. 3 for iridium. However, this is consistent with the higher melting point and boiling point for platinum hexafluoride.

Osmium and rhenium produce osmium hexafluoride and rhenium hexafluoride, respectively. Both of these compounds have melting points and boiling points that are lower than iridium hexafluoride. There similar results can be expected at slightly lower temperatures than when etching iridium.

Ruthenium produces ruthenium pentafluoride, which has a melting point of 101 degrees Celsius and a boiling point of 250 degrees Celsius. Due to the higher temperatures, the process will likely need to be at a temperature greater than approximately 250 degrees to produce a volatile etch reactant.

Additional alternative embodiments are possible within the scope of the present invention. Other variations of the method, or material, within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of removing metal from selected areas of a substrate comprising the steps of:
   a) depositing metal on the substrate;
   b) forming and patterning a mask to expose selected metal areas;
   c) exposing the metal to a fluorine-containing plasma;
   d) heating the metal to a temperature at which a volatile metal-fluorine compound forms; and
   e) exhausting the metal-fluorine compound.

2. The method of claim 1, wherein the metal is selected from the group consisting of iridium, platinum, ruthenium, osmium, and rhenium.

3. The method of claim 1, wherein the mask is a photoresist mask.

4. The method of claim 1, wherein the mask is a hard mask.

5. The method of claim 4, wherein the mask comprises silicon dioxide or silicon nitride.

6. The method of claim 1, wherein the fluorine-containing plasma is formed within an etch chamber by introducing a non-chlorofluorocarbon source of fluorine-containing gas and igniting a plasma.

7. The method of claim 6, wherein the etch chamber is maintained at a pressure of between approximately 5 and 50 mTorr.

8. The method of claim 6, wherein the fluorine-containing gas comprises carbon tetrafluoride ($CF_4$), nitrogen trifluoride ($NF_3$) or sulfur hexafluoride ($SF_6$).

9. The method of claim 6, wherein the fluorine-containing gas further comprises oxygen.

10. The method of claim 1, wherein the metal is heated to a temperature above 150 degrees Celsius.

11. A method of removing metal from selected areas of a substrate comprising the steps of:
   a) depositing iridium on a substrate;
   b) forming a hard mask over the iridium;
   c) patterning the mask to expose selected areas of irdium;
   d) placing the substrate in an ECR plasma etch chamber at a pressure of between 5 and 50 mTorr;
   e) heating the substrate and metal to a temperature greater than approximately 150 degrees Celsius;
   f) introducing a non-chlorofluorocarbon, fluorine-containing gas into the chamber; and
   g) forming a fluorine-containing plasma, whereby iridium is exposed to the fluorine-containing plasma within the chamber and forms a volatile iridium-fluoride compound.

12. The method of claim 11, wherein the hard mask comprises silicon dioxide or silicon nitride.

13. The method of claim 11, wherein the non-chlorofluorocarbon, fluorine containing gas is selected from the group consisting of carbon tetrafluoride ($CF_4$), nitrogen trifluoride ($NF_3$) or sulfur hexafluoride ($SF_6$).

14. The method of claim 11, further comprising the step of exhausting the iridium-fluoride compound.

15. A method of removing metal from selected areas of a substrate comprising the steps of:
   a) depositing platinum on a substrate;
   b) forming a hard mask over the platinum;
   c) patterning the mask to expose selected areas of platinum;
   d) placing the substrate in an ECR plasma etch chamber at a pressure of between 5 and 50 mTorr;
   e) heating the substrate and metal to a temperature greater than approximately 190 degrees Celsius;
   f) introducing a non-chlorofluorocarbon, fluorine-containing gas into the chamber; and
   g) forming a fluorine-containing plasma, whereby platinum is exposed to the fluorine-containing plasma within the chamber and forms a volatile platinum-fluoride compound.

16. The method of claim 15, wherein the hard mask comprises silicon dioxide or silicon nitride.

17. The method of claim 15, wherein the non-chlorofluorocarbon, fluorine containing gas is selected from the group consisting of carbon tetrafluoride ($CF_4$), nitrogen trifluoride ($NF_3$) or sulfur hexafluoride ($SF_6$).

18. The method of claim 15, further comprising the step of exhausting the platinum-fluoride compound.

* * * * *